United States Patent [19]
Baranowski et al.

[11] Patent Number: 6,046,574
[45] Date of Patent: Apr. 4, 2000

[54] BATTERY DROPOUT CORRECTION FOR BATTERY MONITORING IN MOBILE UNIT

[75] Inventors: Robert Baranowski; Christopher P. Wieck, both of San Diego, Calif.

[73] Assignees: Sony Corporation, Tokyo, Japan; Sony Electronics Inc., Park Ridge, N.J.

[21] Appl. No.: 09/326,471

[22] Filed: Jun. 4, 1999

[51] Int. Cl.$^7$ .......................... H01M 10/44; H01M 10/46
[52] U.S. Cl. ................................. 320/132; 320/DIG. 21
[58] Field of Search .................................. 320/127, 128, 320/132, 135, 149, DIG. 18, DIG. 21

[56] References Cited

U.S. PATENT DOCUMENTS

| | | |
|---|---|---|
| 5,473,262 | 12/1995 | Yoshimatsu . |
| 5,596,260 | 1/1997 | Moravec et al. ............ 320/DIG. 21 X |
| 5,721,482 | 2/1998 | Benvegar et al. . |
| 5,838,139 | 11/1998 | Greene . |
| 5,844,884 | 12/1998 | Szlenski . |
| 5,936,383 | 8/1999 | Ng et al. .................................. 320/132 |

*Primary Examiner*—Edward H. Tso
*Attorney, Agent, or Firm*—Skjerven, Morrill, MacPherson, Franklin & Friel LLP; David W. Heid

[57] ABSTRACT

A mobile electronic device can operate in multiple modes, each at a respective current load. Monitoring a battery in such a mobile device includes acquiring a sensed battery voltage during a particular operating mode and converting the sensed battery voltage to a scaled voltage for a known battery discharge curve having a well-defined turn-off voltage. The known battery discharge curve is preferably one for a full current load. The scaled voltage is then compared with the well-defined turn-off voltage to determine the amount of energy remaining in the battery. Operating times for other operating modes can also be calculated and displayed for the user's information.

21 Claims, 3 Drawing Sheets

BATTERY DROPOUT CORRECTION FOR BATTERY MONITORING IN MOBILE UNIT

FIELD OF THE INVENTION

The present invention relates to monitoring the condition of batteries. More specifically, the present invention relates to a method of monitoring the voltage of a battery in a mobile electronic unit. This method enables the electronic device to provide a low battery warning signal and/or to display options for operating modes available under the present battery condition.

BACKGROUND

In a battery powered mobile unit or device it is necessary to monitor the battery voltage so that the device can be properly shut down before the battery supply voltage drops below a threshold for acceptable operation of the unit. Proper shutdown often involves saving configuration parameters in a non-volatile memory and/or providing either the user or an electrical or mechanical device with proper warning prior to shutdown.

One approach includes simply monitoring the battery voltage. A problem associated with this approach, however, is that the battery voltage, when measured at a point beyond the battery terminals, depends upon the ohmic losses or the drop in voltage caused by a current passing through a resistive path. In addition, the battery itself includes some variable ohmic loss, which is dependent upon the amount of charge remaining in the battery and the current being drawn from the battery. For example, a fully charged battery might measure 4.2 V at the terminals under a very small load such as <1 mA, but measure 3.9 V under a load of 1 A. This voltage drop at the terminals is due to the output impedance of the battery. The output impedance can depend on the charge of the battery. Thus, a half-discharged battery measuring 3.5 V at 1 mA might only provide 3.1 V under a 1 A load. standby and transmit modes with current loads of 10 mA, 30 mA and 700 mA, respectively. The sleep and standby modes may be treated as the same "light" load, and a single threshold voltage can be selected for shutdown under the light load. If the minimum acceptable terminal voltage for the battery is 3.0 V, then one can select a single point under load corresponding to this point. For example, a 3.4 V under the "light" load condition may drop to 3.0 V under the 700 mA load. The mobile phone would then know that at 3.4 V or below, it cannot go to the transmit mode without causing a supply voltage shortage. This simple approach, however, is not well-suited to applications in which there are many different modes of current loading. Because the voltage at the battery terminals can vary significantly among the various loads, selecting a single point under load at which to shut down would not be an efficient use of the battery, as certain applications would be closed prematurely.

Another approach at monitoring the battery charge status includes monitoring the energy flow both into and out of the battery. By monitoring the current into and out of the battery, one can determine its exact charge status. While this approach provides extremely accurate information as to the charge status of the battery, it is very expensive because it requires additional circuitry to monitor the current into and out of the battery.

There is a need, therefore, for a relatively simple but accurate way of monitoring the amount of energy remaining in the battery of an electronic device capable of operating in various modes, each having a particular current load. It would also be desirable to calculate all of the operating mode possibilities available for the electronic device under the present battery condition and to display such options to the user.

SUMMARY

The present invention is designed to meet these needs by creating a relationship between each operating mode of an electronic device and a known battery discharge curve with a well-defined turn-off voltage. Preferably, the known battery discharge curve is for a full current load, since it encompasses the lowest possible battery voltages. This relationship enables the electronic device to convert any battery voltage reading at any operating mode current load to a scaled battery voltage for the known discharge curve and to compare the scaled voltage with the turn-off voltage in order to determine the amount of energy remaining in the battery.

In accordance with one embodiment of the present invention, a method is provided for monitoring the voltage of a battery in an electronic device having multiple operating modes, each at a respective current load. The method includes acquiring a sensed battery voltage during a particular operating mode. The method further includes converting the sensed battery voltage to a scaled voltage for a known battery discharge curve. The known battery discharge curve has a known current load and a known turn-off voltage. The method also includes comparing the scaled voltage to the known turn-off voltage.

In accordance with another embodiment of the present invention, a method is provided for monitoring the voltage of a battery in an electronic device having multiple operating modes and includes generating a formula to curve fit a battery discharge curve for a current load of a respective operating mode to a battery discharge curve for a full current load. The full current load battery discharge curve has a known turn-off voltage. The method further includes acquiring a sensed battery voltage during an operating mode, converting the sensed battery voltage with the formula to a scaled voltage for the full current load battery discharge curve, and comparing the scaled voltage to the known turn-off voltage.

In accordance with still another embodiment of the present invention, a method is provided for operating an electronic device having multiple modes of operation, each mode operating at a respective current load. The method includes acquiring a sensed battery voltage during a particular mode of operation and converting the sensed battery voltage to a scaled voltage for a battery discharge curve having a full current load and a known turn-off voltage. The method further includes calculating operating times for a plurality of operating modes and displaying a list of options indicating the plurality of operating modes and their respective operating times.

In accordance with a further embodiment of the invention, an electronic device is provided which includes a plurality of applications, each operating at a respective current load. The device further includes a battery, a voltage monitor, and a control unit. The voltage monitor monitors a sensed voltage of the battery, which provides power to each of the applications. The control unit converts the sensed voltage to a scaled voltage for a known battery discharge curve having a known current load and a known turn-off voltage. The control unit also compares the scaled voltage to the known turn-off voltage.

BRIEF DESCRIPTION OF THE DRAWINGS

The present invention may be better understood, and its numerous features and advantages made apparent to those skilled in the art by referencing the accompanying drawings.

The use of the same reference symbols in different drawings indicates similar or identical items.

DETAILED DESCRIPTION

Figure 1:
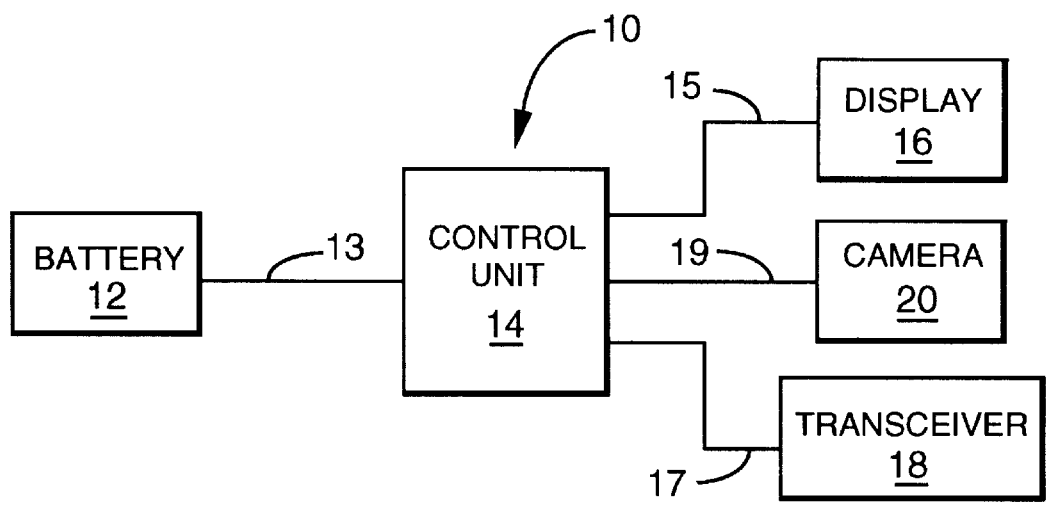
FIG. 1 is a schematic diagram of an electronic device in accordance with the present invention.

FIG. 1 illustrates an electronic device 10 in accordance with the present invention. Electronic device 10 can be a cellular phone, labtop computer, palmtop or any other battery-powered device. Electronic device 10 illustrated here is a mobile phone having multiple operating modes. Electronic device 10 includes a battery 12, a control unit 14, which may be, for example, a microprocessor, and a display 16. Battery 12 is electrically coupled via line 13 to control unit 14, which in turn is electrically coupled via line 15 to display 16. Electronic device 10 further includes various applications such as a transceiver 18 for transmitting and receiving calls and a camera 20. Transceiver 18 and camera 20 are electrically coupled to control unit 14 via lines 17 and 19, respectively.

Figure 2:
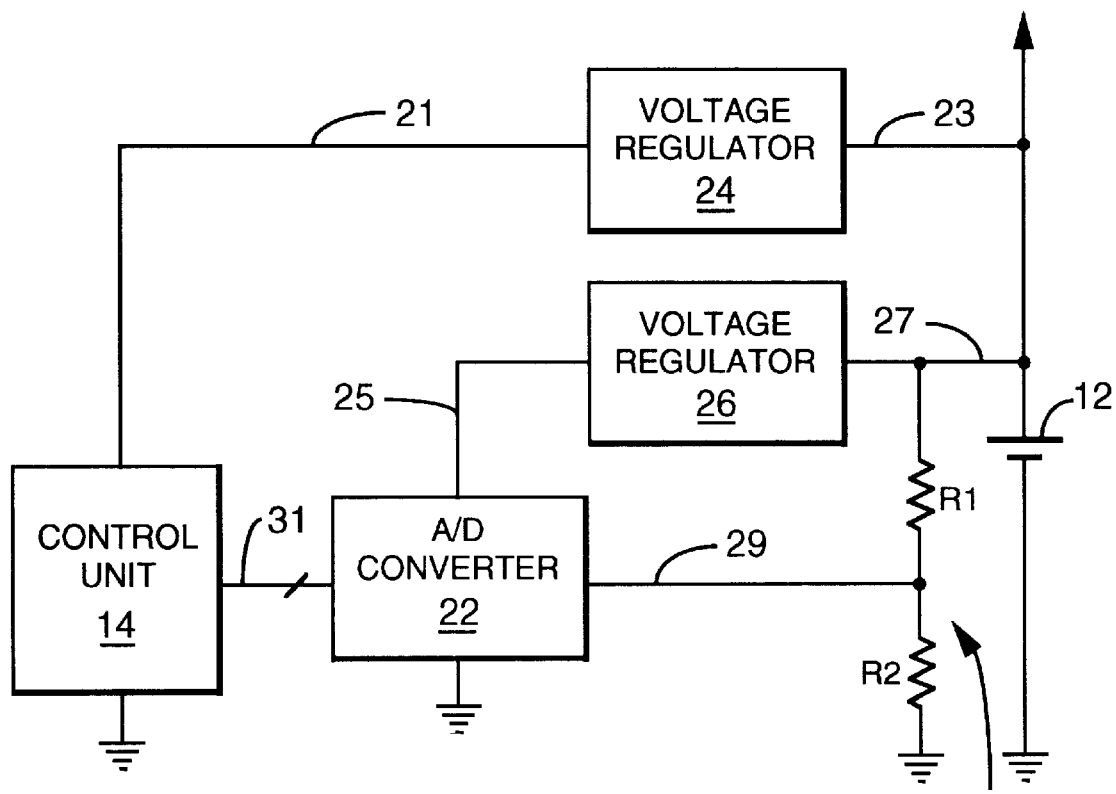
FIG. 2 is a schematic diagram of a battery monitoring portion of the electronic device of FIG. 1.

Battery 12 provides power for electronic device 10. As illustrated in FIG. 2, battery 12 supplies power to control unit 14 via lines 21 and 23, to an analog-to-digital (A/D) converter 22 via lines 25 and 27, and to other loads of electronic device 10 such as display 16, transceiver 18 and camera 20. Voltage regulators 24 and 26, which are of conventional construction, regulate the amount of voltage which battery 12 supplies to control unit 14 and A/D converter 22, respectively. Additional voltage regulators (not shown) control the voltage to the other loads 24 of electronic device 10. A voltage monitor such as a voltage divider 28, including resistors R1 and R2, in parallel with battery 12 provides an analog signal to A/D converter 22 via line 29. A/D converter 22 converts the analog signal to a digital one and passes the digital signal along line 31 to control unit 14. Thus, control unit 14 is capable of monitoring a sensed voltage of battery 12 during operation of electronic device 10.

As discussed above, electronic device 10 has multiple operating modes. By way of example, a multi-application cellular phone may have at least six distinct operating modes: (1) phone in standby, applications off, (2) phone in standby, applications on; (3) phone in call, applications off; (4) phone in call, applications on; (5) phone off, applications on; and (6) camera on, applications on. In addition, when the applications are on, the phone may operate with or without backlight. Each operating mode has its own current profile. Table 1 provides a simplified illustration of the different current categories at which the various modes operate. The currents in the present example range from a low current load of approximately 50 mA to a turbo, or full current load, of 1.6 A.

TABLE 1

| Phone Mode | Current Category |
|---|---|
| Phone in standby, applications off | Low |
| Phone in standby, applications on | Medium |
| Phone in call, applications off | High |
| Phone in call, applications on | Turbo |
| Phone off, applications on | Medium |
| Camera on, applications on | High |

The different current loads at which electronic device 10 operates affect the sensed battery voltage reading of voltage divider 28 differently. A fully charged battery might measure 4.2 V at the terminal under a low current load of 50 mA. The same fully charged battery, however, might measure only 3.8 V under a full current load of 1.6 A. Accordingly, to monitor a sensed battery voltage accurately, one needs to take into account the current load of the particular operating mode.

Control unit 14 monitors the amount of energy remaining in battery 12 by acquiring sensed battery voltage readings from voltage divider 28 and converting these sensed voltage readings to scaled voltages for a known battery discharge curve. Preferably, control unit 14 scales the sensed battery voltage to a battery discharge curve for a full current load, since the full current load encompasses the lowest possible battery voltages. The known battery discharge curve has a known, well-defined turn-off voltage, at which electronic device 10 or a particular operation of electronic device 10 should be shut down. By scaling the sensed voltage readings to the known battery discharge curve, control unit 14 of electronic device 10 can accurately determine the amount of energy remaining in battery 12, independent of the operating mode. Electronic device 10 can then indicate on display 16 the approximate level of charge remaining in battery 12.

Figure 3:
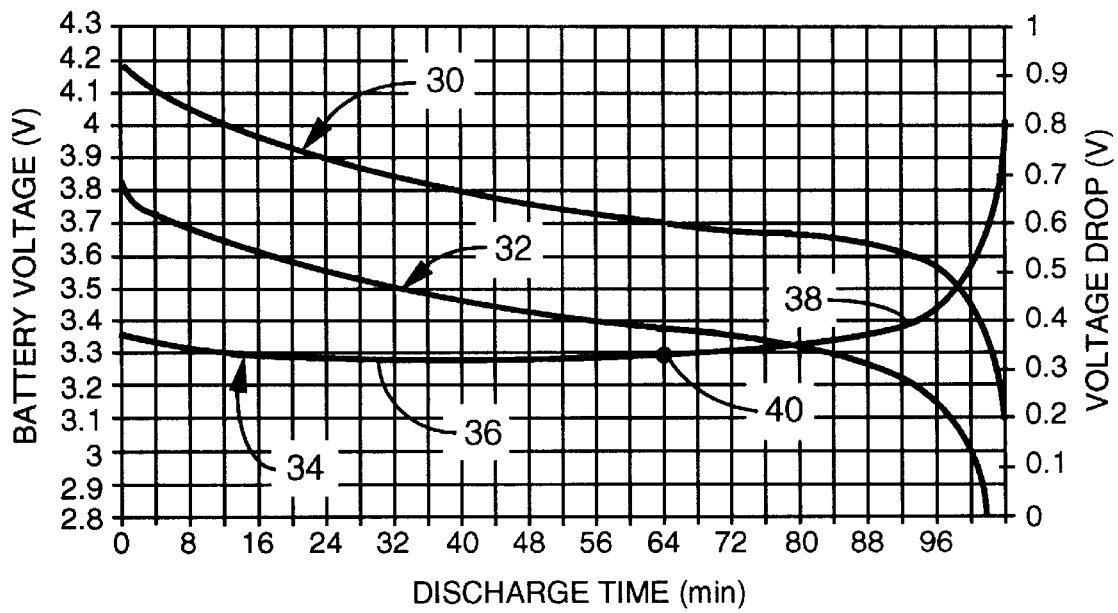
FIG. 3 is an exemplary pulsed battery discharge curve for a current load of an operating mode of the electronic device.

Control unit 14 uses formulas generated in accordance with the invention to scale a sensed voltage to the known battery discharge curve. Because electronic device 10 may operate in various modes and at very different current loads, each current load has a unique formula for scaling the sensed voltage to the known battery discharge curve. Different operating modes with the same or similar current loads may be grouped in the same current category, as illustrated in Table 1. Each formula is obtained by creating a pulsed battery discharge curve, such as that shown in FIG. 3, including: a battery discharge curve 30 for a current load of a respective current category, a battery discharge curve 32 for a known current load (e.g., the full current load); and a voltage drop curve 34. The pulsed battery discharge curve is generated by discharging battery 12 under two applicable loads: a current load for the particular current category in question; and the full current load. Battery 12 is pulsed for a couple of seconds at the first current load and then for a couple of seconds at the second current load until fully discharged. The curves illustrated in FIG. 3 were generated by discharging battery 12 for two seconds each at a low current category load of 50 mA and the full current load of 1.6 A. The full current load has a known turn-off at 3.05 V.

Voltage drop curve 34 plots the difference in voltage between the two discharge curves 30 and 32. The values for voltage drop curve 34 are indicated along the right most axis in FIG. 3. Voltage drop curve 34 illustrates how the apparent output impedance of the battery changes over the discharge life of the battery. Along a first portion 36 of voltage drop curve 34, the voltage drop is relatively constant, while along a second portion 38, the voltage drop rapidly rises with time. The voltage drop along first portion 36 equals the true output impedance of the battery, whereas along second portion 38, the voltage drop increases due to inefficiencies in the chemical process inside of the battery. In the example shown, the voltage drop is approximately 0.33 V along first portion 36. At a transition point 40 of approximately 64 min. first portion 36 of voltage drop curve 34 shifts to second portion 38. This voltage drop between the two battery discharge curves must be compensated for in any type of voltage scaling equation. The voltage drop may change over battery lifetime, temperature, calibration variations or other charge or discharge specifics. Actual product implementation may take these other curve variations into consideration.

Similar pulsed battery discharge curves are generated for current loads in the medium and high current categories. Because the current load for the turbo current category is the known, full current load (e.g., 1.6 A), it is not necessary to generate a pulsed battery discharge curve or to scale the sensed voltage. The sensed and scaled voltages of the battery at the full current load are identical.

When electronic device 10 operates at a mode other than the full current load, turbo mode, the sensed voltage must be converted to the known full current load by subtracting an offset amount specific to the particular current category. This offset amount varies depending on whether the sensed voltage is greater or less than the voltage on that curve at the time corresponding to that of transition point 40. As discussed above, transition point 40 for the voltage drop curve 34 in FIG. 3 occurs at 64 min, and the corresponding voltage on the 50 mA discharge curve at 64 min. is 3.7 V. Thus, when the sensed voltage is greater than 3.7 V, the offset equals 0.33 V, the true output impedance of the battery. When the sensed voltage is less than 3.7 V, the following equation determines the offset:

$$\text{offset} = 0.33 + (3.7 - \text{Sensed\_Voltage})/1.6$$

The offset equals the true output impedance of the battery (e.g., 0.33 V) plus a portion of the difference between the voltage on the 50 mA curve at transition point 40 and the sensed voltage. The value of 1.6 is generated by curve fitting voltage drop curve 34. Table 2 provides a summary of the voltage scaling equations for each of the current categories of the exemplary cellular phone.

TABLE 2

| Current Category | Voltage Scaling Equation |
|---|---|
| Low | If Sensed_Voltage>3.7, then Offset=0.33 |
| | Else Offset=0.33+(3.7−Sensed_Voltage)/1.6 |
| | Scaled_Voltage=Sensed_Voltage−Offset |
| Medium | If Sensed_Voltage>3.6, then Offset=0.25 |
| | Else Offset=0.25+(3.6−Sensed_Voltage)/2.5 |
| | Scaled_Voltage=Sensed_Voltage−Offset |
| High | If Sensed_Voltage>3.45, then Offset=0.133 |
| | Else Offset=0.133+(3.45−Sensed_Voltage)/5 |
| | Scaled_Voltage=Sensed_Voltage−Offset |
| Turbo | Scaled_Voltage=Sensed_Voltage |

For the final product implementation, these voltage scaling equations can be performed in the A/D count domain, with all of the arithmetic as integers.

It should be noted that the offset varies by approximately 100 mV between each current category. This 100 mV difference is effectively the resolution of the turn-off accuracy over all of the current loads. If this accuracy is insufficient, additional current categories, or a linear function, can be used to increase the accuracy.

Several methods can be employed to increase the accuracy of the voltage scaling equation over all current loads. Even though the current may vary linearly over the entire current range, software can limit current readings until times of distinct, quantifiable currents. One example is during a call. Because of the large dynamic range of a code division multiple access (CDMA) transmitter, estimating the current during active transmit would be quite complex, requiring knowledge of the transmitted power and possibly some calibration data for the particular transmitter. This complexity can be reduced by timing the readings such that they occur only between transmit slots, when the current is most predictable. By applying this principle, the use of four current categories may be enough for the final implementation.

Figure 4:
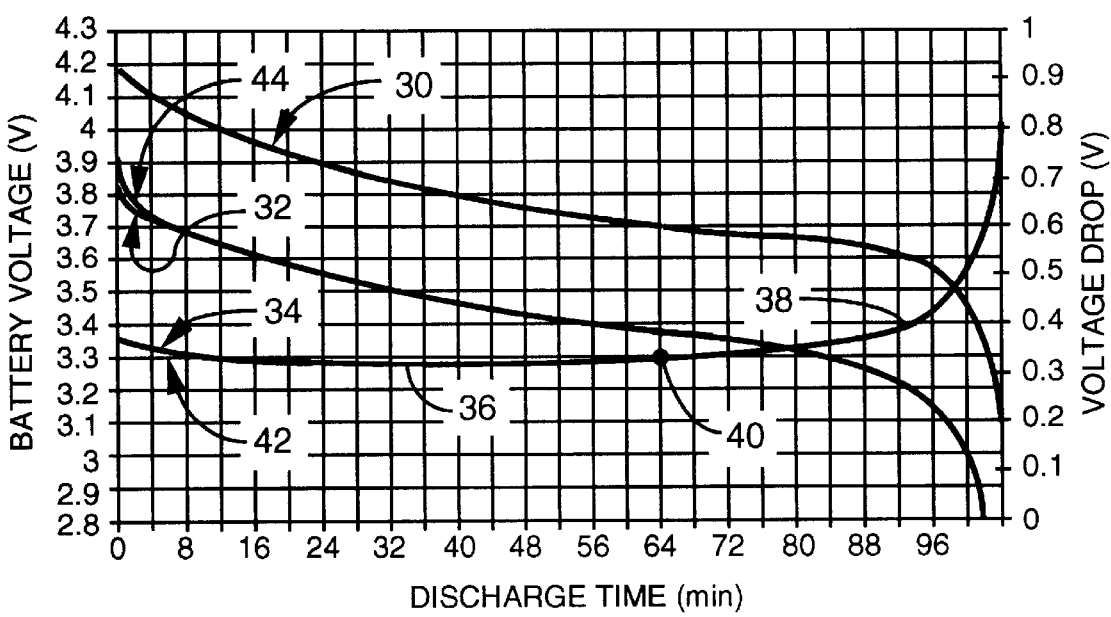
FIG. 4 is an exemplary pulsed battery discharge curve similar to that of FIG. 3, including a calculated voltage drop and a scaled discharge curve for the 50 mA load.

FIG. 4 illustrates the accuracy of the voltage scaling equation for the low current category 50 mA load. The battery discharge curve 30 for the 50 mA load, battery discharge curve 32 for the 1.6 A load, and voltage drop curve 34 are the same as in FIG. 3. The graph also provides a calculated voltage drop curve 42 based on the offset values, and a scaled battery discharge curve 44 for the 50 mA load. As illustrated in FIG. 4, scaled battery discharge curve 44 for the 50 mA load closely approximates battery discharge curve 32 for the 1.6 A load.

In addition to calculating the amount of energy remaining in battery 12, control unit 14 can also calculate the amount of time at which electronic device 10 can operate in the various operating modes. By way of example, Table 3 provides a sample of the amount of current necessary to run electronic device 10 under various operating modes. Given the current consumption for each operating mode, the sensed battery voltage and the current load, control unit 14 can determine all of the operating possibilities available under the present battery condition.

TABLE 3

| Operating Mode | w/o Application | Application only | Application & Backlighting |
|---|---|---|---|
| Transceiver Idle | 30 mA | 280 mA | 630 mA |
| Transceiver Low | 300 mA | 550 mA | 900 mA |
| Transceiver Medium | 500 mA | 750 mA | 1100 mA |
| Transceiver High | 700 mA | 950 mA | 1300 mA |

Thus, if the present battery condition permits operation at up to 1000 mA only, control unit 14 can calculate the possible operating modes and might present on display 16 the following options to the user:

Operate with:
    Transceiver & Application only (10 min.)?
    Application & Backlighting w/o Transceiver (20 min.)?
    Camera & Backlighting w/o Transceiver (5 min.)?
    Camera & Transceiver w/o Backlighting (7 min.)?
    More options . . .

The user can then select under which operating mode, electronic device 10 should proceed.

The options displayed to user do not need to include all possible options. Instead, display 16 might list only those options which are operating or attempting to be launched. For example, if transceiver 18 or camera 20 is off, display 16 need not include these options. If transceiver 18 is being powered up, then the options that have been idle or the backlighting should be considered for shutdown first. When transceiver 18 receives a call, it will transmit in response to the page and initially, some caller ID information might be available. The user can choose to retain this function, possibly sacrificing backlighting temporarily, but will be unable to answer the call unless electronic device 10 is very close to the base station, thereby minimizing the transmit power. With the caller ID information, the user can decide the importance of the call and shut down other applications and respond to the call, move closer to the base station, or find another means to return the call.

Figure 5:
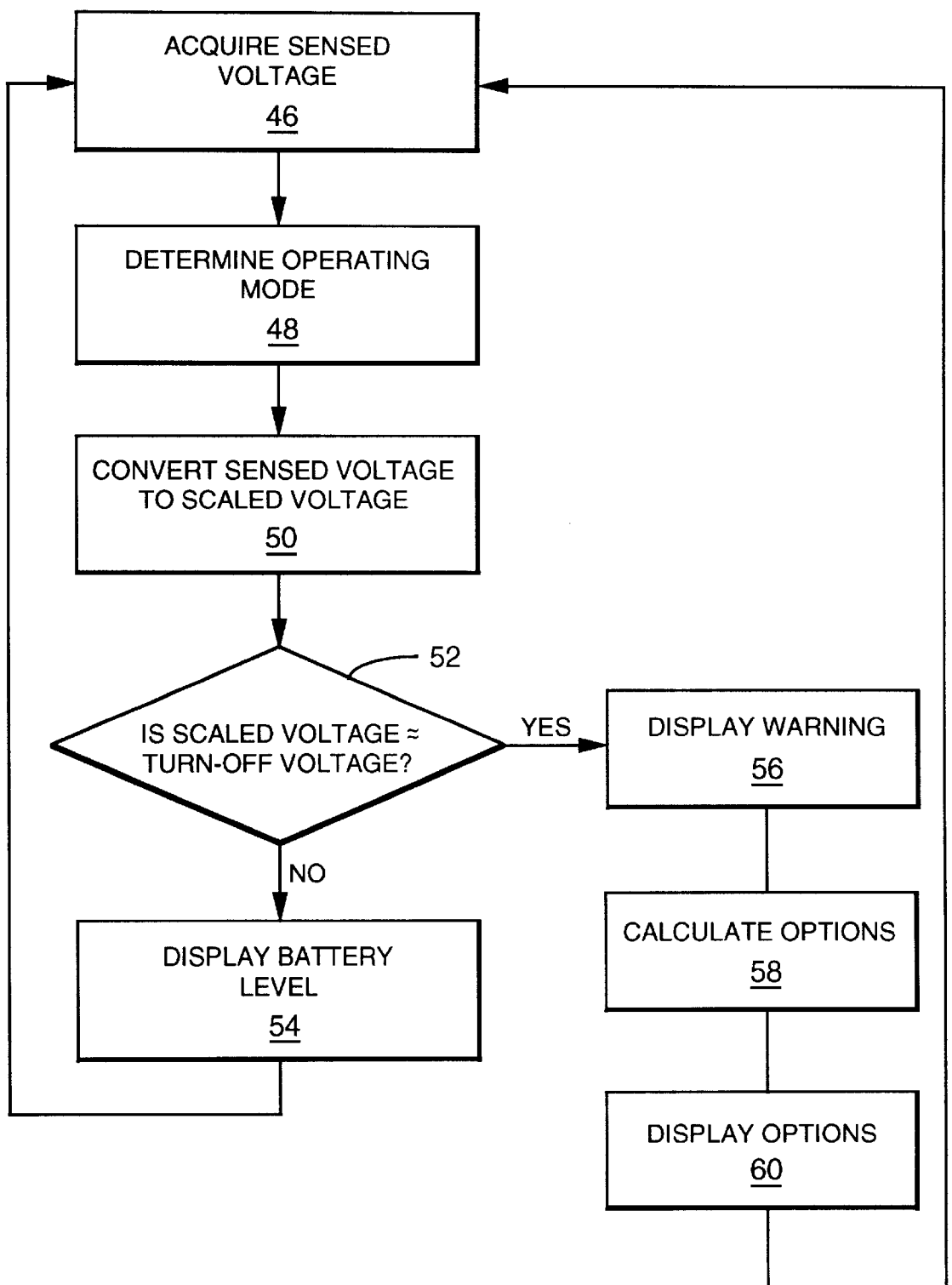
FIG. 5 is a flow diagram illustrating the process which the electronic device of FIG. 1 performs in order to monitor the energy remaining in its battery.

The flow chart of FIG. 5 illustrates the process electronic device 10 uses to monitor battery 12. In step 46, electronic device 10 acquires a sensed voltage reading of battery 12. These readings are periodically performed with voltage divider 28 sensing the voltage of battery 12. A/D converter 22 converts the analog signal from voltage divider 28 to a digital signal for control unit 14. In step 48, control unit 14 determines the operating mode and, thus, the current category of electronic device 10. In the alternative, the order of performing steps 46 and 48 may be interchanged, with control unit 14 determining the operating mode prior to acquiring the sensed voltage reading. In step 50, the control unit converts, using the appropriate voltage scaling equation for the current category, the sensed voltage to obtain a scaled voltage for battery 12. In step 52, the control unit compares the scaled voltage with the known turn-off voltage to determine whether the particular application should be turned off. If the scaled voltage is greater than the turn-off voltage, display 16 in step 54 provides a battery level indicative of an approximate amount of energy remaining in battery 12. Electronic device 10 then returns to step 46 to monitor battery 12 periodically. If the scaled voltage is approximately equal to the turn-off voltage, electronic device 10 in step 56 issues a low battery warning on display 16. In addition, in step 58 control unit 14 calculates, based on the present battery voltage reading, current load and known turn-off voltage, operating times for possible modes of operation. In step 60, display 16 presents these options to the user, enabling the user to select a desired operating mode. Electronic device 10 then returns to step 46 to monitor battery 12 under the selected operating mode.

Thus, the present invention enables electronic device 10 having multiple modes of operation to estimate accurately the amount of energy remaining in battery 12. Electronic device 10 converts the sensed battery voltage reading at any current load to a known discharge curve with a well-defined turn-off voltage. The scaled voltage is then compared with the turn-off voltage to determine whether a low battery warning should be issued. In addition, electronic device 10 calculates operating times for various operating modes and presents a list of possible options to the user.

While the present invention has been described with reference to a specific embodiment, the description is illustrative of the invention and is not to be construed as limiting the invention. For example, although the present invention is shown with respect to four current categories, fewer or additional current categories may also be used. Various modifications may occur to those skilled in the art without departing from the true spirit and scope of the invention as defined by the appended claims.

What is claimed is:

1. A method for monitoring a voltage of a battery in an electronic device, the device having multiple modes of operation, each mode operating at a respective current load, the method comprising:

acquiring a sensed battery voltage during a particular mode of operation;

converting the sensed battery voltage to a scaled voltage for a known battery discharge curve having a known current load and a known turn-off voltage; and comparing the scaled voltage to the known turn-off voltage.

2. The method of claim 1, wherein the known battery discharge curve is for a full current load.

3. The method of claim 1, further comprising:

generating a pulsed battery discharge curve for at least one operating mode, the pulsed battery discharge curve including a discharge curve for the current load of the respective operating mode, a discharge curve for the known current load, and a voltage drop curve; and generating a voltage scaling equation for the pulsed battery discharge curve, the voltage scaling equation converting the discharge curve for the current load of the respective operating mode to the discharge curve for the known current load.

4. The method of claim 3, wherein the voltage drop curve includes a first portion having a substantially uniform voltage drop over time, a second portion having a voltage drop that rapidly rises over time, and a transition point between the first and second portions, and wherein generating the voltage scaling equation includes determining an offset, the offset equaling a first value when the sensed voltage is greater than a voltage for the current load of the respective operating mode corresponding to the transition point and equaling a second value when the sensed voltage is less than the voltage for the current load corresponding to the transition point, the first value being equal to the voltage drop at the transition point, and the second value being greater than the first value.

5. The method of claim 4, wherein the second value equals the first value plus a portion of a difference between the voltage for the current load of the respective operating mode corresponding to the transition point and the sensed voltage.

6. The method of claim 1, further comprising displaying a battery level indicative of an approximate amount of energy remaining in the battery.

7. The method of claim 1, further comprising providing a message when the scaled voltage is approximately equal to the known turn-off voltage, the message indicating that the respective operating mode should be shut down.

8. The method of claim 1, further comprising:

calculating remaining operating times at current loads of the respective operating modes for the electronic device; and providing a list of possible operating modes available under a present battery condition.

9. A method for monitoring a voltage of a battery in an electronic device, the device having multiple modes of operation, each mode operating at a respective current load, the method comprising:

generating a formula to curve fit a battery discharge curve for the current load of a respective operating mode to a battery discharge curve for a full current load, the full current load battery discharge curve having a known turn-off voltage;

acquiring a sensed battery voltage during an operating mode;

converting the sensed battery voltage with the formula to a scaled voltage for the full current load battery discharge curve; and comparing the scaled voltage to the known turn-off voltage.

10. The method of claim 9, wherein generating a formula includes generating a plurality of formulas, each formula associated with a respective operating mode, and wherein converting the sensed battery voltage includes using the respective formula to convert the sensed battery voltage to the scaled voltage.

11. The method of claim 9, wherein generating a formula curve includes:

generating a pulsed battery discharge curve including the battery discharge curve for the current load of the respective operating mode, the full current load battery discharge curve, and a voltage drop curve including a first portion having a substantially uniform voltage drop over time, a second portion having a voltage drop that rapidly rises over time, and a transition point between the first and second portions; and determining an offset, the offset equaling a first value when the sensed voltage is greater than a voltage for the current load of the respective operating mode corresponding to the transition point and equaling a second value when the sensed voltage is less than the voltage for the current load corresponding to the transition point, the first value being equal to the voltage drop at the transition point, the second value being greater than the first value.

12. The method of claim 11, wherein the second value equals the first value plus a portion of a difference between the voltage for the current load of the respective operating mode corresponding to the transition point and the sensed voltage.

13. The method of claim 9, further comprising displaying a battery level indicative of an approximate amount of energy remaining in the battery.

14. The method of claim 9, further comprising providing a message when the scaled voltage is approximately equal to the known turn-off voltage, the message indicating that the respective operating mode should be shut down.

15. The method of claim 9, further comprising:

calculating remaining operating times at current loads of the respective operating modes for the electronic device; and providing a list of possible operating modes available under a present battery condition.

16. A method for operating an electronic device having multiple modes of operation, each mode operating at a respective current load, the method comprising:

acquiring a sensed battery voltage during a particular mode of operation;

converting the sensed battery voltage to a scaled voltage for a battery discharge curve having a full current load and a known turn-off voltage;

calculating operating times for a plurality of operating modes; and displaying a list of options indicating the plurality of operating modes and their respective operating times.

17. The method of claim 16, further comprising:

generating a pulsed battery discharge curve for at least one operating mode, the pulsed battery discharge curve including a discharge curve for the current load of the respective operating mode, the discharge curve for the full current load, and a voltage drop curve; and generating a voltage scaling equation for the pulsed battery discharge curve, the voltage scaling equation converting the discharge curve for the current load of the respective operating mode to the discharge curve for the known current load.

18. An electronic device including a plurality of applications, each application operating at a respective current load, the electronic device comprising:

a battery electrically coupled to the plurality of applications, the battery providing power to the plurality of applications of the electronic device;

a voltage monitor coupled to the battery, the voltage monitor providing a sensed voltage of the battery; and a control unit coupled to the plurality of applications, the battery and the voltage monitor, the control unit converting the sensed voltage to a scaled voltage for a known battery discharge curve having a known current load and a known turn-off voltage and comparing the scaled voltage to the known turn-off voltage.

19. The electronic device of claim 18, wherein the known battery discharge curve is for a full current load.

20. The electronic device of claim 18, further comprising a display for presenting a battery level indicative of an amount of energy remaining in the battery.

21. The electronic device of claim 18, wherein the control unit calculates remaining operating times at current loads of the respective applications, and further comprising a display for presenting a list of possible operating modes available under the present battery condition.

* * * * *

UNITED STATES PATENT AND TRADEMARK OFFICE
CERTIFICATE OF CORRECTION

| | | |
|---|---|---|
| PATENT NO. | : 6,046,574 | Page 1 of 1 |
| APPLICATION NO. | : 09/326471 | |
| DATED | : April 4, 2000 | |
| INVENTOR(S) | : Robert Baranoswki et al. | |

It is certified that error appears in the above-identified patent and that said Letters Patent is hereby corrected as shown below:

Col. 1, line 37, after "load." begin new paragraph and insert:

--Monitoring the battery voltage itself is suitable for a device with a single mode of operation (i.e., one current load) or for one with different modes of opeartion but similar current loads. An example of the latterdevice is a mobile phone having sleep, --

Signed and Sealed this

Twenty-eighth Day of August, 2007

JON W. DUDAS
*Director of the United States Patent and Trademark Office*